US010446573B2

(12) United States Patent
Liao

(10) Patent No.: US 10,446,573 B2
(45) Date of Patent: Oct. 15, 2019

(54) SEMICONDUCTOR STRUCTURE AND METHOD FOR FORMING THE SAME

(71) Applicant: MACRONIX INTERNATIONAL CO., LTD., Hsinchu (TW)

(72) Inventor: Ting-Feng Liao, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 188 days.

(21) Appl. No.: 15/818,972

(22) Filed: Nov. 21, 2017

(65) Prior Publication Data

US 2019/0157289 A1 May 23, 2019

(51) Int. Cl.

| | |
|---|---|
| ***H01L 27/11*** | (2006.01) |
| ***H01L 27/11582*** | (2017.01) |
| ***H01L 29/06*** | (2006.01) |
| ***H01L 27/11556*** | (2017.01) |
| ***H01L 23/528*** | (2006.01) |
| ***H01L 23/532*** | (2006.01) |
| ***H01L 29/10*** | (2006.01) |
| ***H01L 21/768*** | (2006.01) |

(Continued)

(52) U.S. Cl.

CPC .. *H01L 27/11582* (2013.01); *H01L 21/76224* (2013.01); *H01L 21/76816* (2013.01); *H01L 21/76831* (2013.01); *H01L 21/76843* (2013.01); *H01L 21/76877* (2013.01); *H01L 23/5283* (2013.01); *H01L 23/53266* (2013.01); *H01L 27/11556* (2013.01); *H01L 29/0649* (2013.01); *H01L 29/1037* (2013.01); *H01L 27/11519* (2013.01); *H01L 27/11565* (2013.01)

(58) Field of Classification Search

CPC ......... H01L 27/11582; H01L 21/76224; H01L 21/76816; H01L 21/76831; H01L 21/76843; H01L 21/76877; H01L 23/5283; H01L 23/53266; H01L 27/1156; H01L 29/0649; H01L 29/1037; H01L 27/11519; H01L 27/11565

See application file for complete search history.

(56) References Cited

U.S. PATENT DOCUMENTS

2013/0083601 A1 4/2013 Liu et al.
2015/0179662 A1* 6/2015 Makala ............ H01L 27/11582 257/314

(Continued)

OTHER PUBLICATIONS

TIPO Office Action dated Apr. 11, 2018 in Taiwan application (No. 106140393).

*Primary Examiner* — Evren Seven
(74) *Attorney, Agent, or Firm* — McClure, Qualey & Rodack, LLP

(57) ABSTRACT

A semiconductor structure includes a plurality of sub-array structures separated from each other by a plurality of isolation structures. The semiconductor structure further includes a three-dimensional array of memory cells. The memory cells include a plurality of cell groups disposed in the sub-array structures, respectively. The semiconductor structure further includes a plurality of conductive structures. Each of the conductive structures includes a plurality of conductive columns correspondingly disposed in each of the isolation structures along an extending direction of the isolation structures. The conductive columns penetrate through the each of the isolation structures. Each of the conductive columns has a circular cross section.

20 Claims, 20 Drawing Sheets

(51) Int. Cl.

| | |
|---|---|
| ***H01L 21/762*** | (2006.01) |
| *H01L 27/11565* | (2017.01) |
| *H01L 27/11519* | (2017.01) |

(56) References Cited

U.S. PATENT DOCUMENTS

| | | | | |
|---|---|---|---|---|
| 2015/0340370 | A1 | 11/2015 | Kim et al. | |
| 2016/0049421 | A1* | 2/2016 | Zhang | H01L 27/11582 257/314 |
| 2016/0329343 | A1 | 11/2016 | Pachamuthu et al. | |
| 2017/0092651 | A1 | 3/2017 | Kim et al. | |
| 2017/0133397 | A1 | 5/2017 | Lee | |
| 2017/0213845 | A1 | 7/2017 | Baba | |
| 2017/0294445 | A1* | 10/2017 | Son | H01L 29/7827 |
| 2017/0373089 | A1* | 12/2017 | Kim | H01L 27/11582 |
| 2018/0130816 | A1* | 5/2018 | Son | H01L 27/11582 |
| 2018/0247949 | A1* | 8/2018 | Choi | H01L 27/11556 |
| 2018/0277556 | A1* | 9/2018 | Kang | H01L 27/11556 |
| 2019/0027490 | A1* | 1/2019 | Shin | H01L 27/11582 |
| 2019/0109149 | A1* | 4/2019 | Park | H01L 27/11565 |

* cited by examiner

SEMICONDUCTOR STRUCTURE AND METHOD FOR FORMING THE SAME

TECHNICAL FIELD

This disclosure relates to a semiconductor structure and a method for forming the same. More particularly, this disclosure relates to a semiconductor structure comprising a three-dimensional array of memory cells and a method for manufacturing the same.

BACKGROUND

For reasons of decreasing volume and weight, increasing power density, improving portability, and the like, three-dimensional (3D) semiconductor structures have been developed. In some typical manufacturing processes for 3D semiconductor structures, a stack comprising a plurality of layers may be formed on the substrate, openings then be formed through the stack, and suitable materials for forming vertical structures are provided into the openings. The openings and the vertical structures formed therein typically have high aspect ratios. This may lead to interior stress and thereby distortion and failure of the devices.

SUMMARY

The disclosure is directed to a semiconductor structure and a method for forming the same. According to the disclosure, the effect of the stress in the semiconductor structure can be decrease by the particular structural design.

In some embodiments, a semiconductor structure is provided. The semiconductor structure comprises a plurality of sub-array structures separated from each other by a plurality of isolation structures. The semiconductor structure further comprises a three-dimensional array of memory cells. The memory cells comprise a plurality of cell groups disposed in the sub-array structures, respectively. The semiconductor structure further comprises a plurality of conductive structures. Each of the conductive structures comprises a plurality of conductive columns correspondingly disposed in each of the isolation structures along an extending direction of the isolation structures. The conductive columns penetrate through the each of the isolation structures. Each of the conductive columns has a circular cross section.

In some embodiments, a method for forming a semiconductor structure is provided. The method comprises following steps. First, an initial structure is provided. The initial structure comprises a plurality of sub-array structures separated from each other by a plurality of isolation regions. Each of the sub-array structures comprises a stack and a plurality of active structures penetrating through the stack. Each of the active structures comprises a channel layer and a memory layer formed between the channel layer and the stack. A plurality of isolation structures are formed in the isolation regions, respectively. Then, a plurality of conductive columns are formed in the isolation structures. The conductive columns penetrate through the isolation structures. Each of the conductive columns has a circular cross section.

Figure 1A:
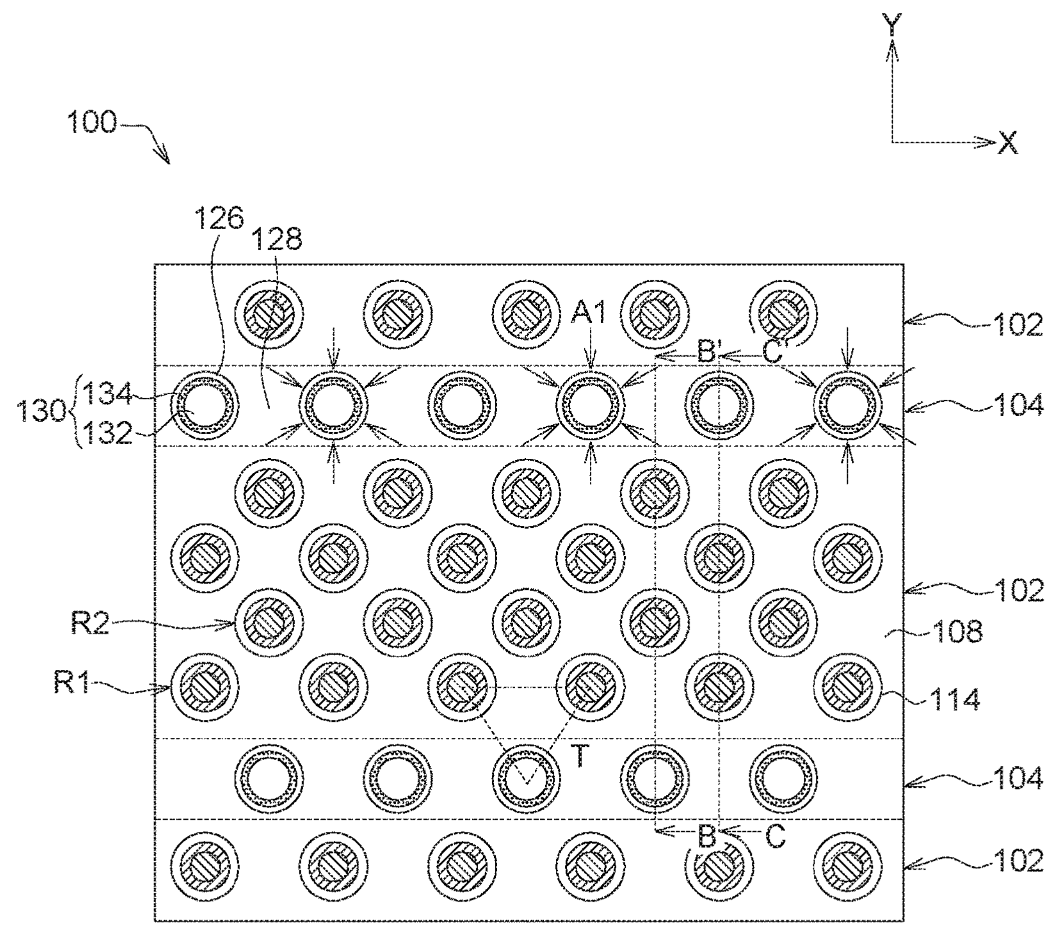
FIGS. 1A-1D illustrate an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

A semiconductor structure according to embodiments comprises a plurality of sub-array structures separated from each other by a plurality of isolation structures. The semiconductor structure further comprises a three-dimensional array of memory cells. The memory cells comprise a plurality of cell groups disposed in the sub-array structures, respectively. The semiconductor structure further comprises a plurality of conductive structures. Each of the conductive structures comprises a plurality of conductive columns correspondingly disposed in each of the isolation structures along an extending direction of the isolation structures. The conductive columns penetrate through the each of the isolation structures. Each of the conductive columns has a circular cross section.

Figure 1B:
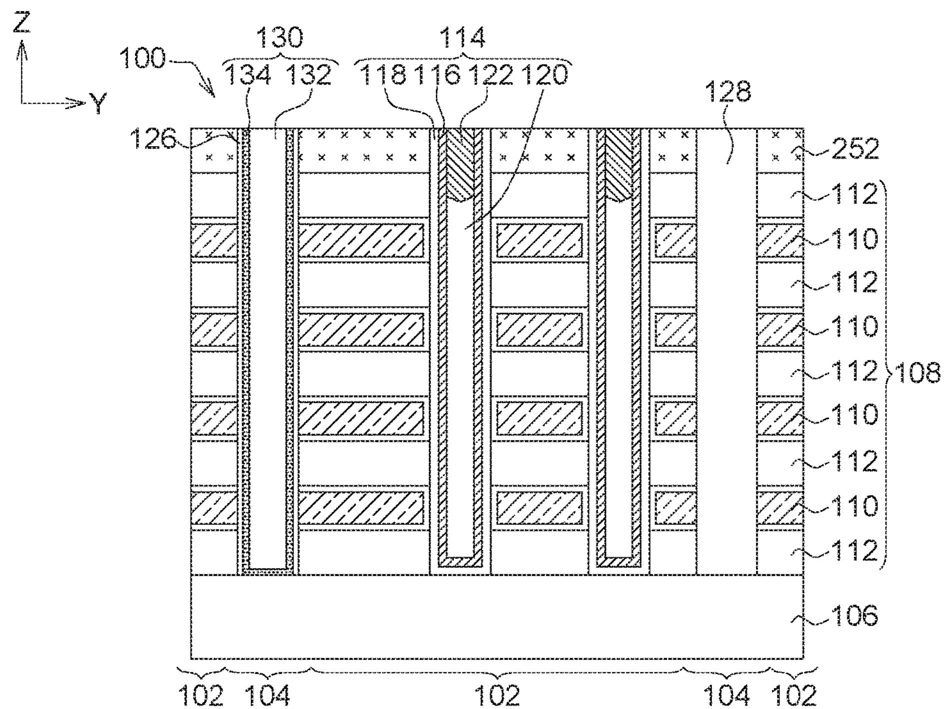
Figure 1C:
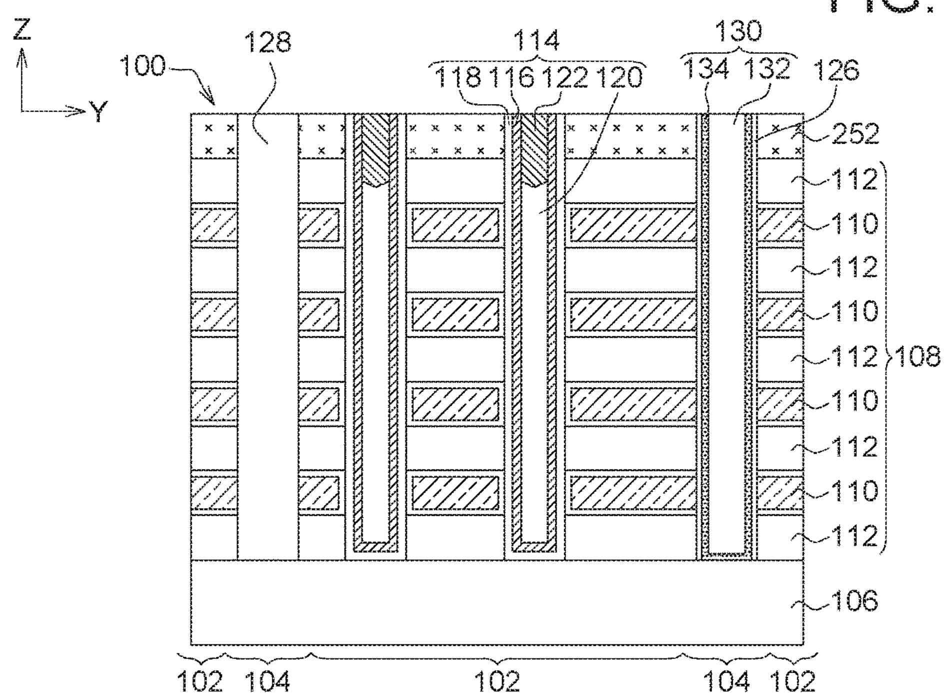
Figure 1D:
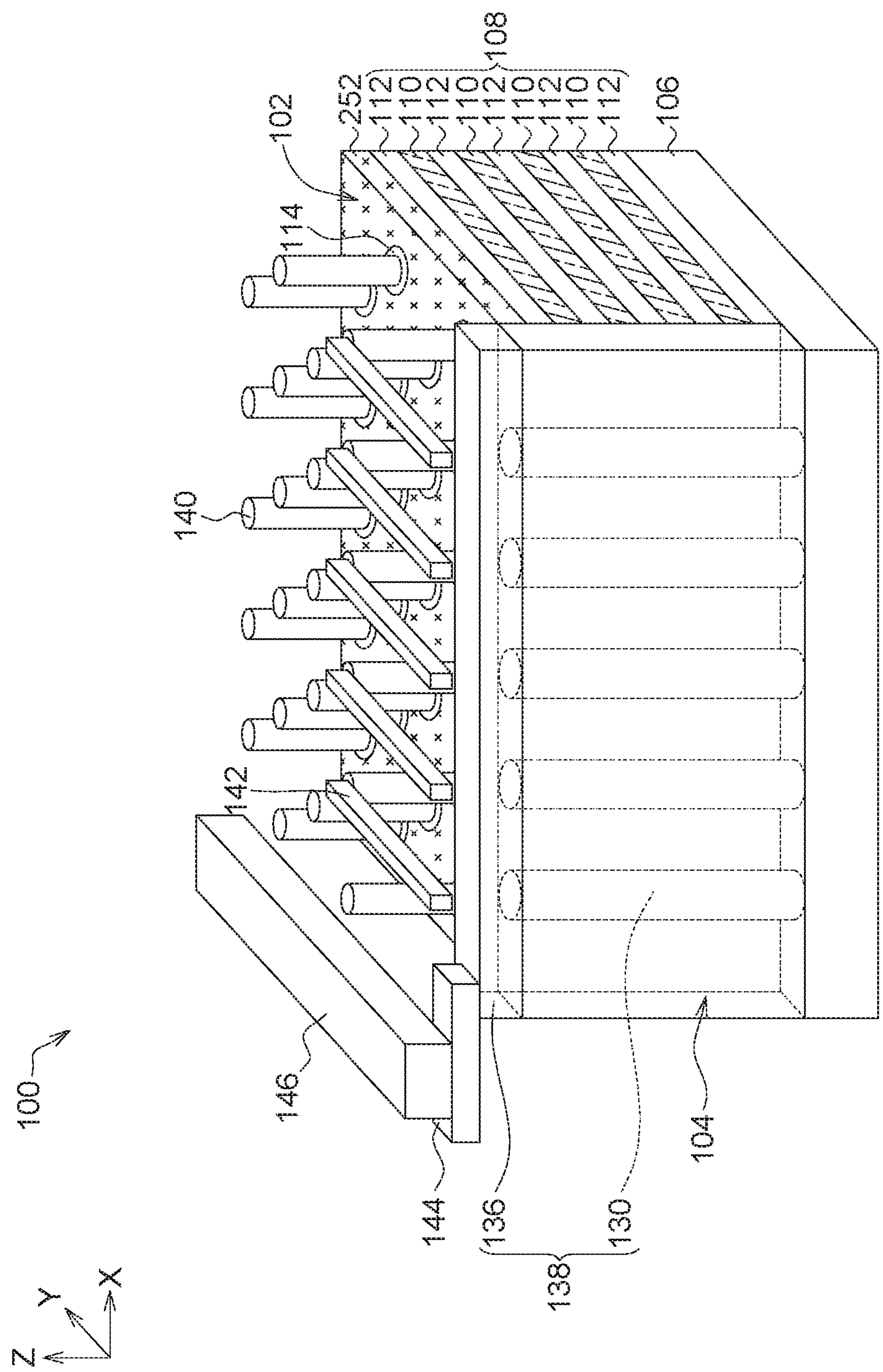

Referring to FIGS. 1A-1D, an exemplary semiconductor structure 100 according to embodiments is shown, wherein FIG. 1A illustrates a top view, FIG. 1B illustrates a cross sectional view along the B-B' line in FIG. 1A, FIG. 1C illustrates a cross sectional view along the C-C' line in FIG. 1A, FIG. 1D illustrate a perspective view, and some components are removed from the drawings for clarity. As shown in FIGS. 1A-1D, the semiconductor structure 100 comprises a plurality of sub-array structures 102 and a plurality of isolation structures 104. The sub-array structures 102 are separated from each other by the isolation structures 104.

According to some embodiments, each of the sub-array structures 102 may comprise a stack 108 disposed on a substrate 106 of the semiconductor structure 100 and a plurality of active structures 114 penetrating through the stack 108. The stack 108 comprises alternately stacked conductive layers 110 and insulating layers 112. Each of the active structures 114 comprises a channel layer 116 and a memory layer 118 disposed between the channel layer 116 and the stack 108. Each of the active structures 114 may further comprise an insulating material 120 filled into a space formed by the channel layer 116. Each of the active structures 114 may further comprise a conductive connector 122 disposed on the insulating material 120. Each of the active structures 114 may have a circular cross section. In some embodiments, the active structures 114 may be formed to be cylinders. In some embodiments, due to the process limitation, the active structures 114 are formed to be reverse truncated cones. Memory cells in the cell group disposed in the each of the sub-array structures 102 are defined by cross points between the conductive layers 110 of the stack 108 and the active structures 114. The cell groups in the plurality of sub-array structures 102 together constitute a three-dimensional array of memory cells.

The isolation structures 104 isolate the sub-array structures 102 and define blocks of the memory cells. According to some embodiments, because conductive columns 130 are disposed therein, each of the isolation structures 104 may comprise a plurality of insulating liners 126 surrounding the conductive columns 130 disposed in the each of the isolation structures 104, respectively. Each of the isolation structures 104 may further comprise a plurality of insulating walls 128 connecting the insulating liners 126. By such arrangements, the isolation function of the isolation structures 104 can be promised.

The semiconductor structure 100 comprises a plurality of conductive structures. Each of the conductive structures comprises a plurality of conductive columns 130 correspondingly disposed in each of the isolation structures 104 along an extending direction of the isolation structures 104, which is the X-direction in the drawings. The conductive columns 130 penetrating through the each of the isolation structures 104. Each of the conductive columns 130 has a circular cross section. Similar to the active structures 114, the conductive columns 130 may be formed to be cylinders, or be formed to be reverse truncated cones (i.e. a diameter at an upper portion is larger than a diameter in a lower portion) due to the process limitation. Each of the conductive columns 130 comprises a conductive core 132 having a circular cross section. Each of the conductive columns 130 may further comprise a barrier layer 134 surrounding the conductive core 132. According to some embodiments, as shown in FIG. 1D, each of the conductive structures may further comprises a conductive line 136 disposed on the conductive columns 130. The conductive line 136 connects the conductive columns 130 for reducing the resistance of the conductive structure. The conductive columns 130, together with the conductive line 136 thereon, constitute a conductive structure 138. The conductive structures may be bit line structures. The conductive connector 122 of each of the active structures 114 may be used for coupling the channel layer 116 to a bit line (142), and the conductive layers 110 may comprise word lines. It can be understood that, in some embodiments, the conductive layers 110 may further comprise a ground select line and the like.

Now referring to FIG. 1A, the active structures 114 in a first row R1 are disposed adjacent to the conductive columns 130 disposed in one of the isolation structures 104, and the active structures 114 in the first row R1 and the conductive columns 130 disposed in the one of the isolation structures 104 may be arranged in an alternate manner. In some embodiments, one of the conductive columns 130 disposed in the one of the isolation structures 104 and adjacent two of the active structures 114 in the first row R1 may be arranged to form an isosceles triangle T. The active structures 114 in a second row R2 are disposed adjacent to the active structures 114 in the first row R1 at a side opposite to the one of the isolation structures 104, the active structures 114 in the second row R2 and the active structures 114 in the first row R1 may be arranged in an alternate manner, and the active structures 114 in the second row and the conductive columns 130 disposed in the one of the isolation structures 104 may be aligned.

According to the embodiments, the conductive columns 130 are formed to have circular cross sections. Such conductive columns can be formed by filling a conductive material into holes. Since the holes having circular cross sections, stress can be uniformly provided from all directions by the insulating materials surrounding the holes, and thereby interior stress of the conductive material can be reduced. The conductive columns 130 formed thereby are also uniformly stressed from all directions by the insulating materials, as indicated by arrows A1 in FIG. 1A. It is beneficial for the stability of the structure.

Figure 2:
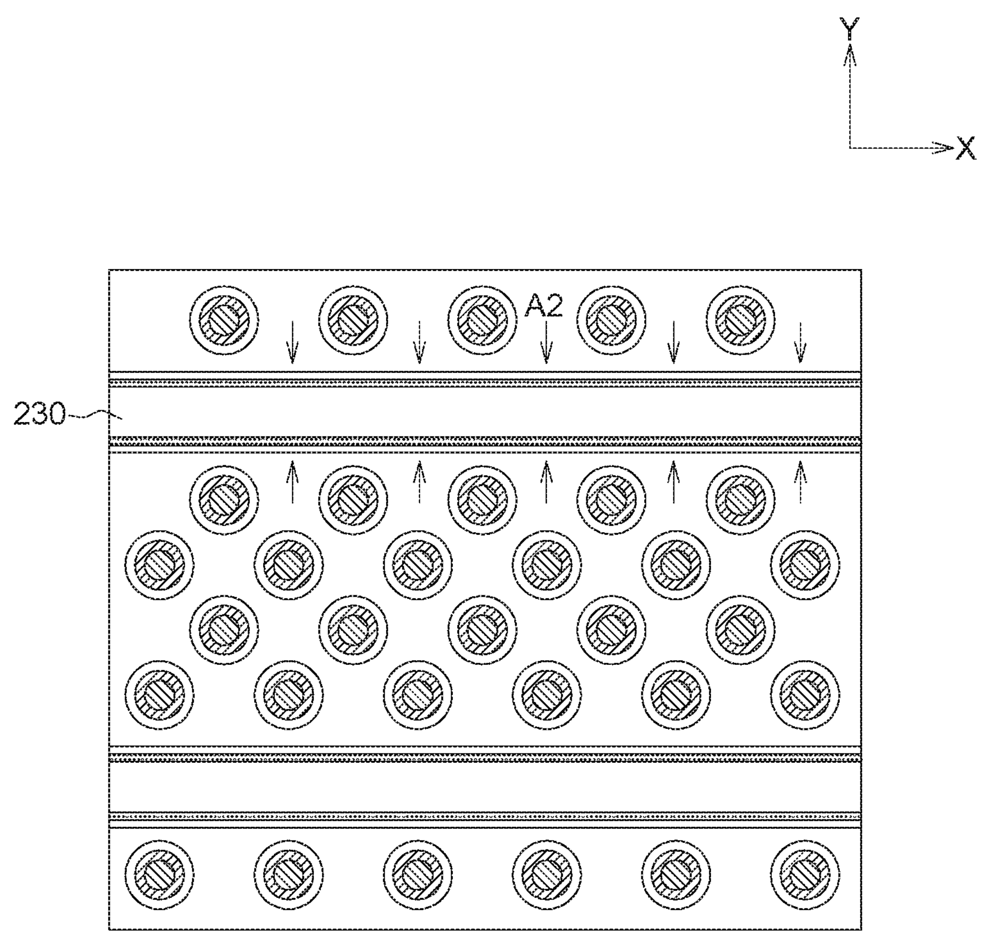
FIG. 2 illustrates a conventional semiconductor structure for comparison.

In contrast, as shown in FIG. 2, in a conventional semiconductor structure, a wall-type conductive structure 230, rather than a plurality of conductive columns 130, is formed in an isolation region separating the sub-array structures. Such a wall-type conductive structure is formed by filling the conductive material into a trench, which is stressed from only two directions. The conductive structure 230 formed thereby sustains stress from only two directions, as indicated by arrows A2, and is easier to bend or distort from the original design due to exterior and interior stress of the conductive material. As the number of layers in the stacks increases and the sizes of the components decrease, such stress becomes stronger due to the high aspect ratio of the trenches. Such stress may also become stronger when the filling quality of the conductive material is better, as a side effect. The bending and distortion conditions are particularly serious in the cases that such conductive structures are formed of tungsten, and more particularly serious in the cases that the conductive layers in the stacks are also formed of tungsten. However, since the resistivity of tungsten is low, it is still the typical choice for forming the conductive layers and the conductive structures. The distortion condition of such conductive structures may be so serious such that the width differences between the wall-type conductive structures are up to about quarter to about half of the widths of the wall-type conductive structures. The bending and distortion conditions may further lead to mis-landing of the contacts and thereby bridges of, for example, bit lines to the top most word line.

While in a semiconductor structure according to the embodiments, conductive columns having circular cross sections are formed instead of the conductive structures like walls, thereby the exterior stress is applied in a more uniform manner, and the stress from the filling of the conductive material can be reduced. As such, mis-landing of the contacts and bridges caused thereby can be prevented. The possibility of device failure can be decreased, and the pass rate of the product can be improved. The alternate arrangement between the conductive columns (130) and the active structures (114) in the adjacent row (R1) as shown in FIG. 1A may provide further process window for the semiconductor structure.

According to some embodiments, the semiconductor structure 100 may further comprise other components, as shown in FIG. 1D. In some embodiments, the semiconductor structure 100 further comprises a plurality of contacts 140 and a plurality of first overlying conductive lines 142. The contacts 140 are disposed on the active structures 114, such as on the conductive connector 122, for coupling the active structures 114 to the first overlying conductive lines 142, which may be bit lines. In some embodiments, the semiconductor structure 100 further comprises a contact 144 and a second overlying conductive line 146. The contact 144 is disposed on the conductive structure 138, such as on the conductive line 136, for coupling the conductive structure 138, which may be the bit line structure, to the second overlying conductive line 146. As shown in FIG. 1D, in some embodiments, an aligning direction of the conductive columns 130 is the same as an extending direction of the conductive line 136, and is perpendicular to an extending direction of the first overlying conductive lines 142 and the second overlying conductive line 146.

A method for forming such a semiconductor structure according to embodiments may comprise following steps. First, an initial structure is provided. The initial structure comprises a plurality of sub-array structures separated from each other by a plurality of isolation regions. Each of the sub-array structures comprises a stack and a plurality of active structures penetrating through the stack. Each of the active structures comprises a channel layer and a memory layer formed between the channel layer and the stack. Then, a plurality of isolation structures are formed in the isolation regions, respectively. Thereafter, a plurality of conductive columns are formed in the isolation structures. The conductive columns penetrate through the isolation structures. Each of the conductive columns has a circular cross section.

Referring to FIGS. 3A-10B, an exemplary forming method according to embodiments is shown, wherein the figures indicated by "A" illustrate top views, and the figures indicated by "B" illustrate corresponding cross sectional views along the B-B' lines in the figures indicated by "A".

Figure 3A:
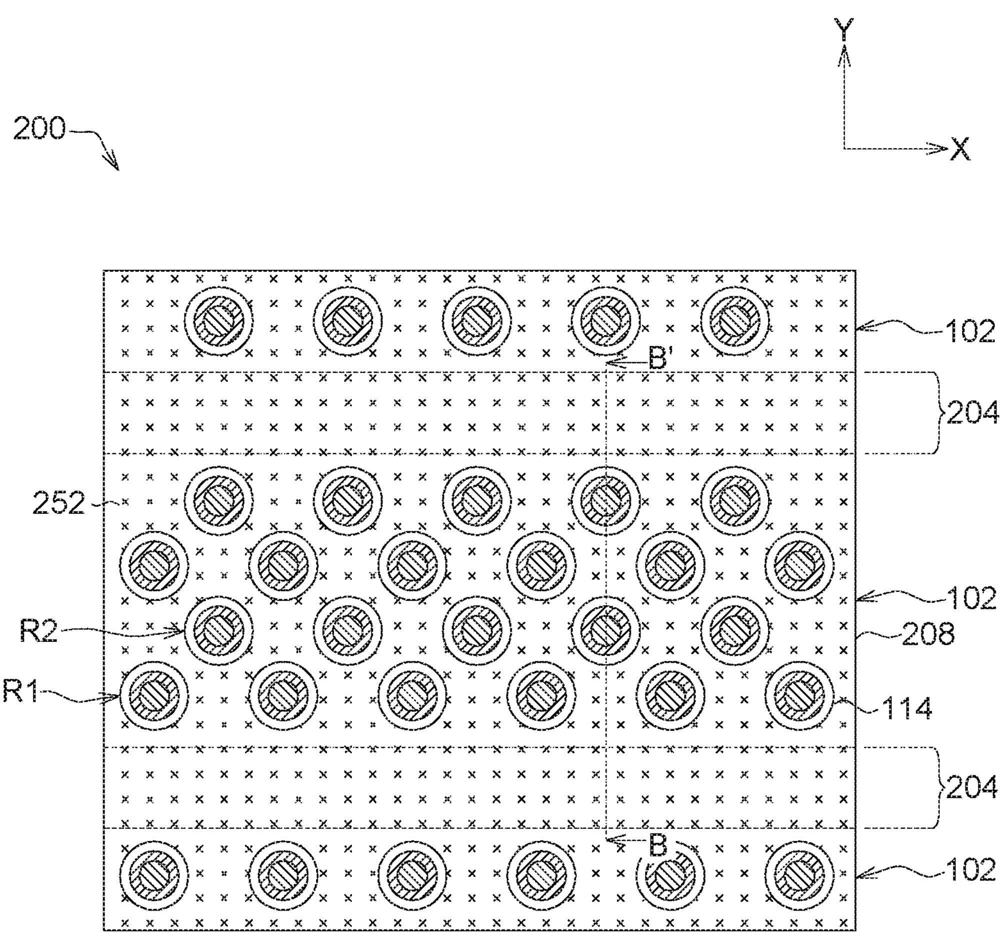
FIGS. 3A-10B show an exemplary method for forming a semiconductor structure according to embodiments.
Figure 3B:
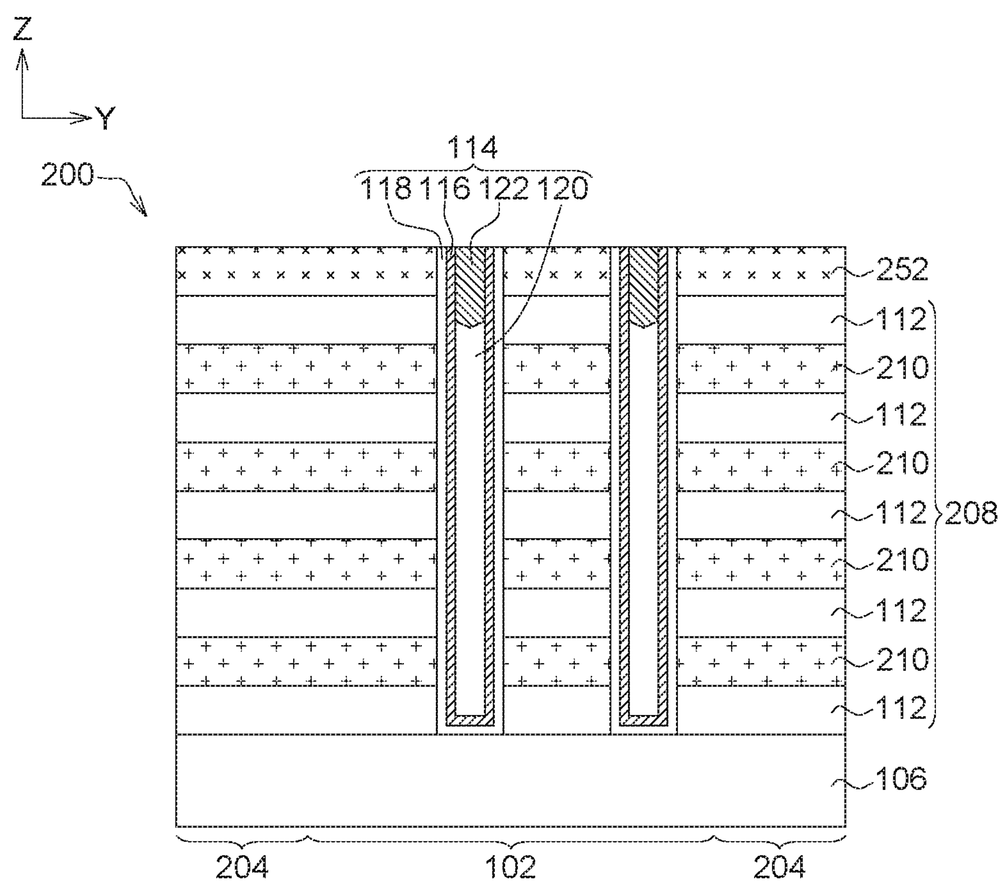

As shown in FIGS. 3A-3B, an initial structure 200 is provided. The initial structure 200 comprises a plurality of sub-array structures 102 separated from each other by a plurality of isolation regions 204. Each of the sub-array structures 102 comprises a stack 208 and a plurality of active structures 114 penetrating through the stack 208. Each of the active structures 114 comprises a channel layer 116 and a memory layer 118 formed between the channel layer 116 and the stack 208. As described above, each of the active structures 114 may further comprise an insulating material 120 filled into a space formed by the channel layer 116 and a conductive connector 122 formed on the insulating material 120. In some embodiments, as shown in FIGS. 3A-3B, the stacks 208 of the initial structure 200 comprise alternately stacked sacrificial layers 210 and insulating layers 112. The sacrificial layers 210 may be formed of nitride. The insulating layers 112 may be formed of oxide. In some embodiments, the initial structure 200 may further comprise a hard mask layer 252 formed on the stack 208, and the active structures 114 also penetrate through the hard mask layer 252.

Figure 4A:
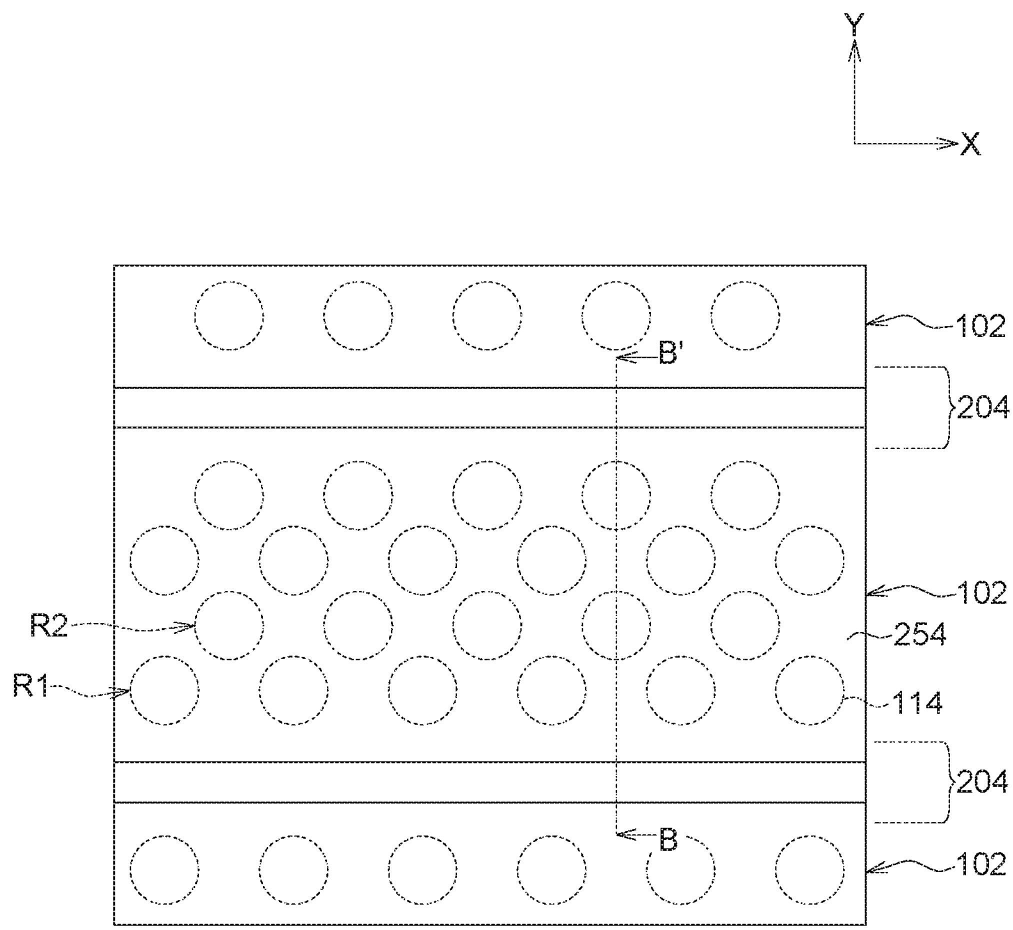
Figure 4B:
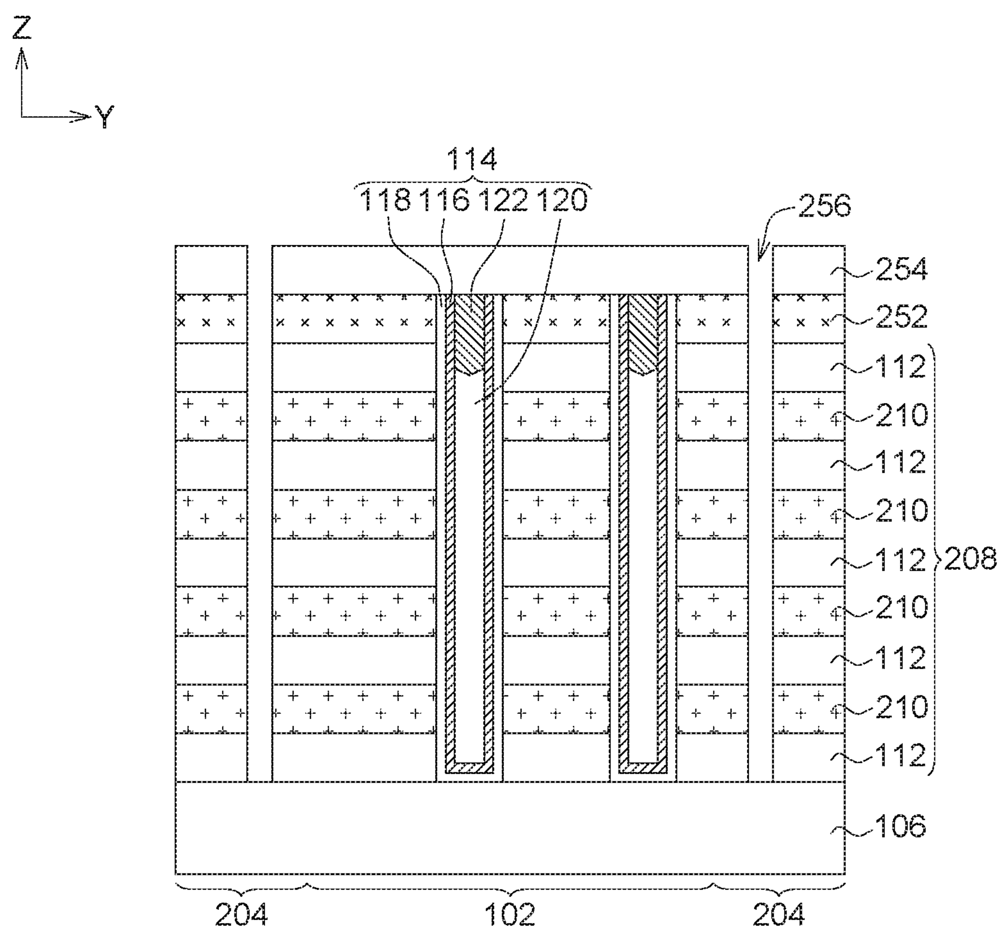

As shown in FIGS. 4A-4B, an interlayer dielectric layer 254 may be optionally formed on the initial structure 200 shown in FIGS. 3A-3B. Then, the isolation structures 104 will be formed in the isolation regions 204. As shown in FIGS. 4A-4B, the formation of the isolation structures 104 may comprise first forming a plurality of trenches 256 in the isolation regions 204, respectively. The trenches 256 may be formed by etching.

Figure 5A:
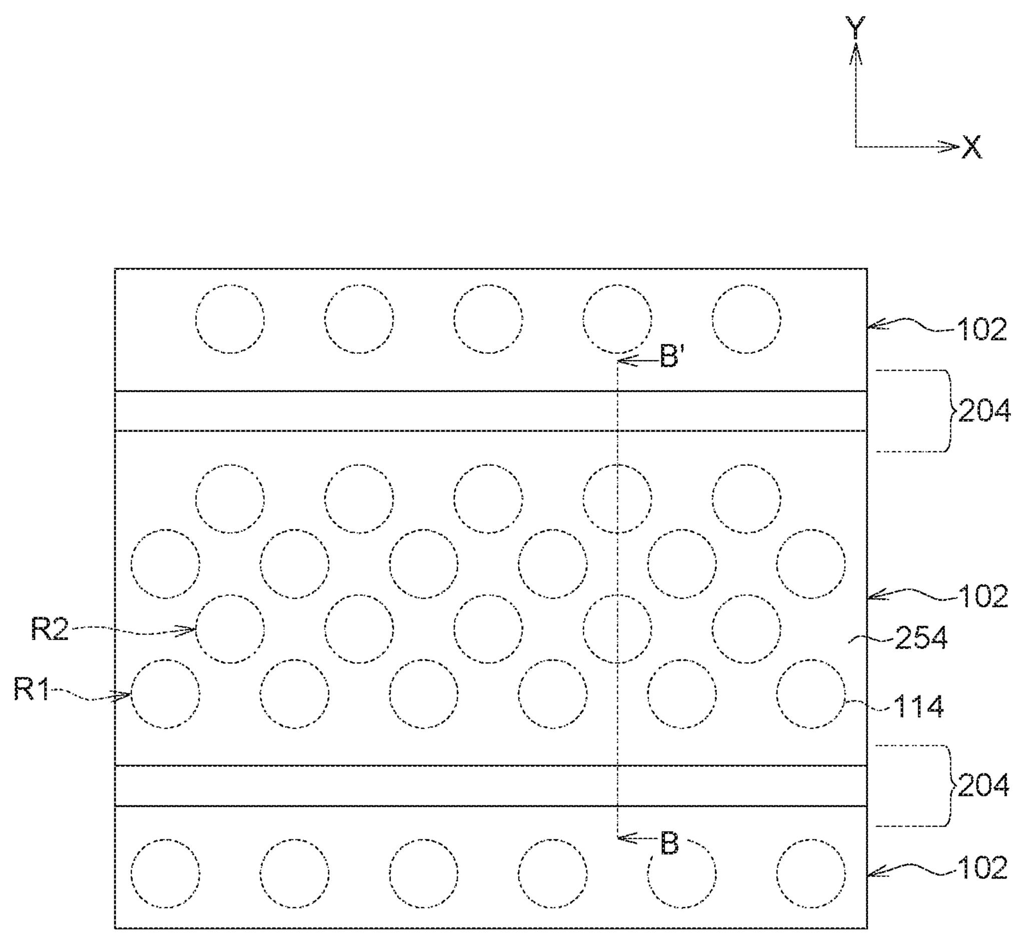
Figure 5B:
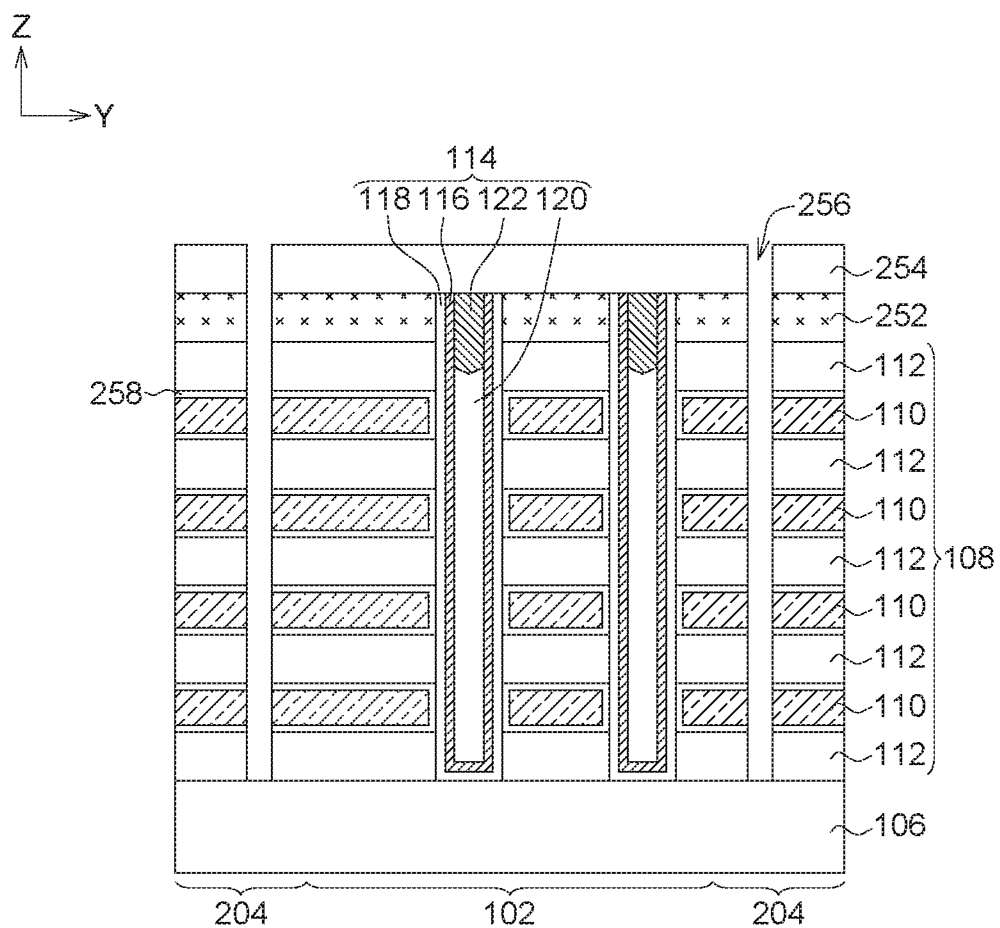

As shown in FIGS. 5A-5B, the sacrificial layers 210 can be replaced with conductive layers 110 through the trenches 256. In some embodiments, after removing the sacrificial layers 210 through the trenches 256, a high-k material may be conformally formed onto the structure, the conductive material for forming the conductive layers 110 then be filled into the remaining spaces. As such, high-k material layers 258 are formed in a manner of encapsulating the conductive layers 110. The conductive layers 110 may be formed of tungsten.

Figure 6A:
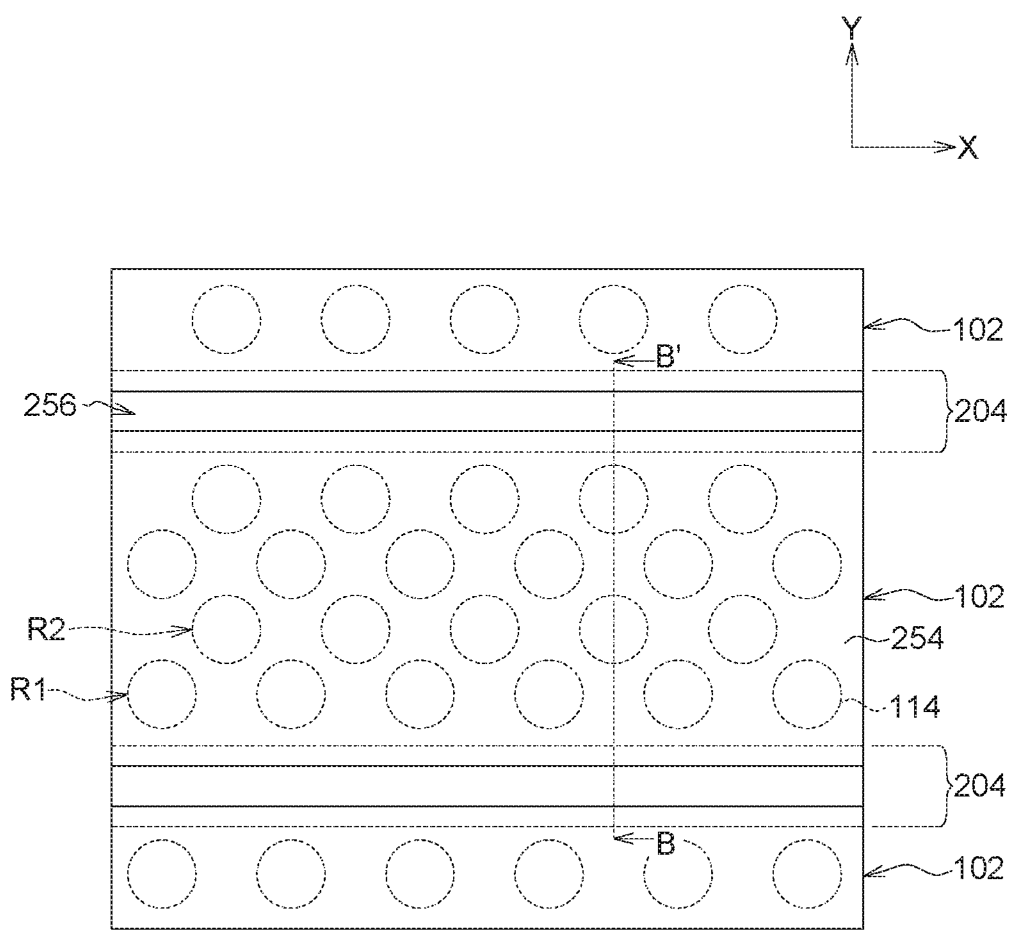
Figure 6B:
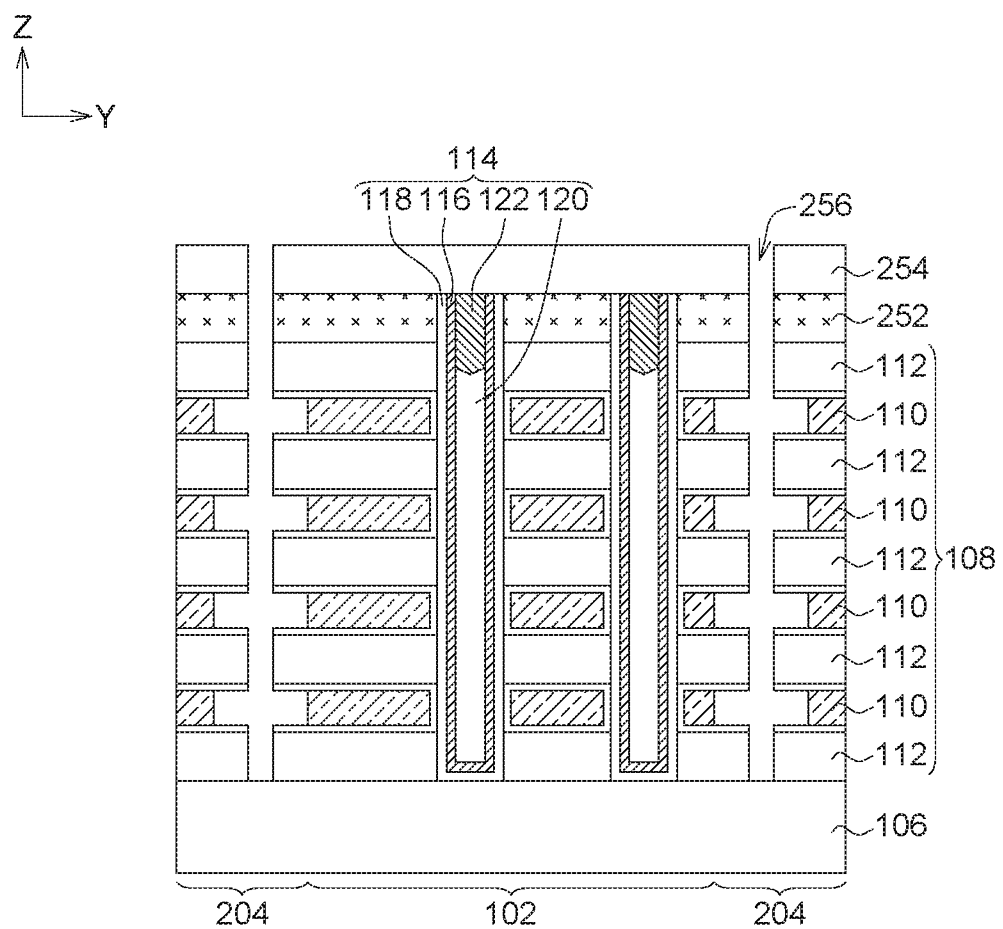
Figure 7A:
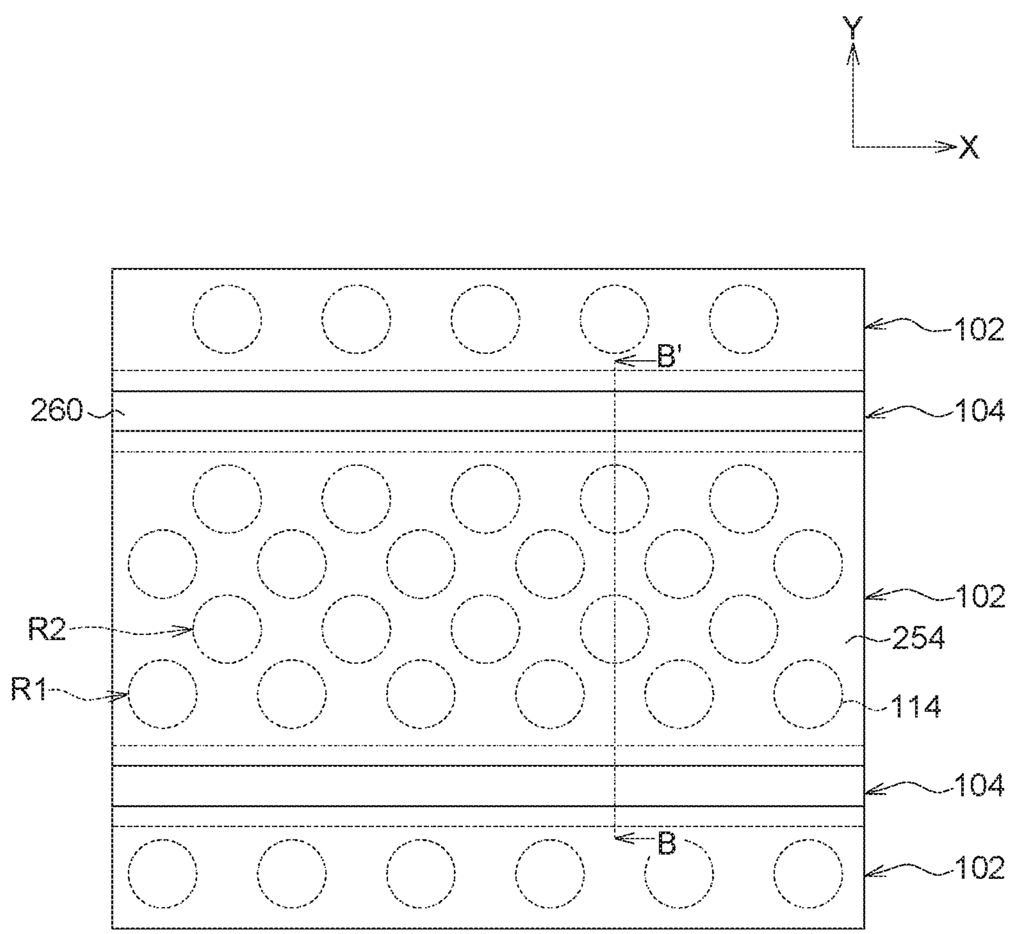
Figure 7B:
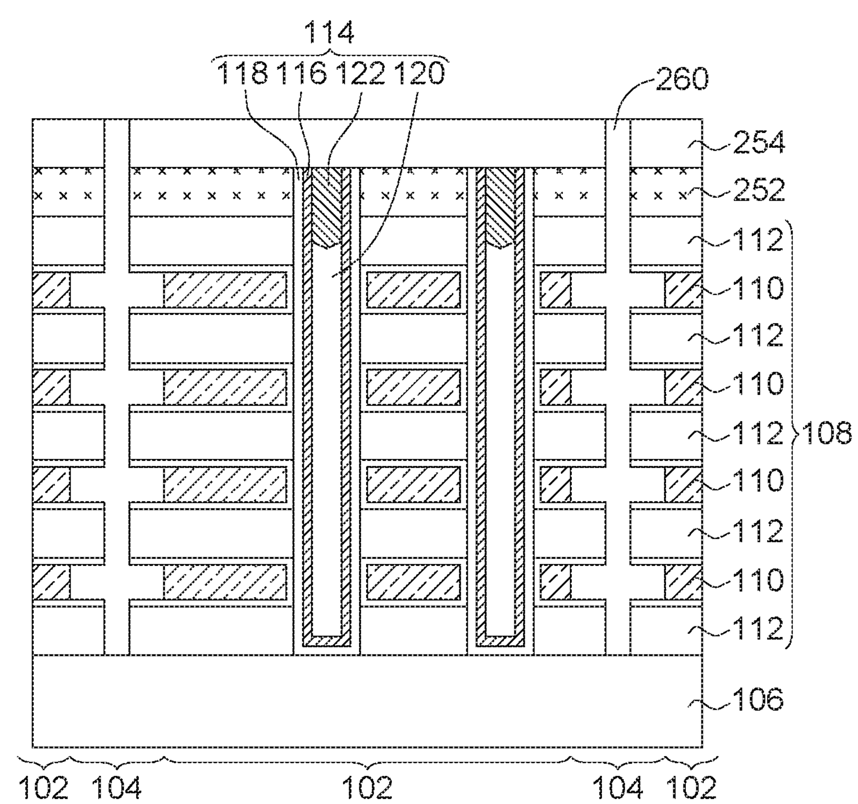

As shown in FIGS. 6A-6B, the conductive layers 110 in the isolation regions 204 may be removed through the trenches 256, such as by etching. Then, as shown in FIGS. 7A-7B, an insulating material 260, such as oxide, is filled into the trenches 256 and spaces produced by removing the conductive layers 110 in the isolation regions 204. As such, a plurality of isolation structures 104 are formed in the isolation regions 204, respectively.

Figure 8A:
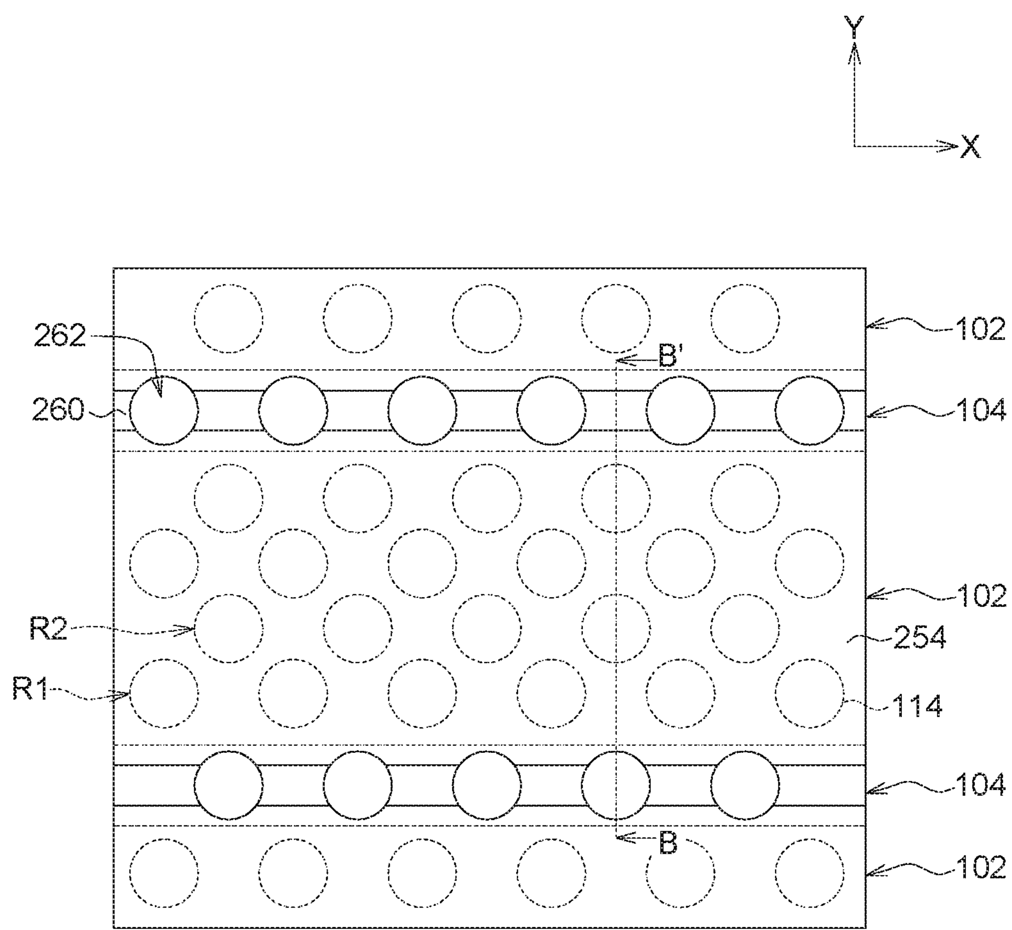
Figure 8B:
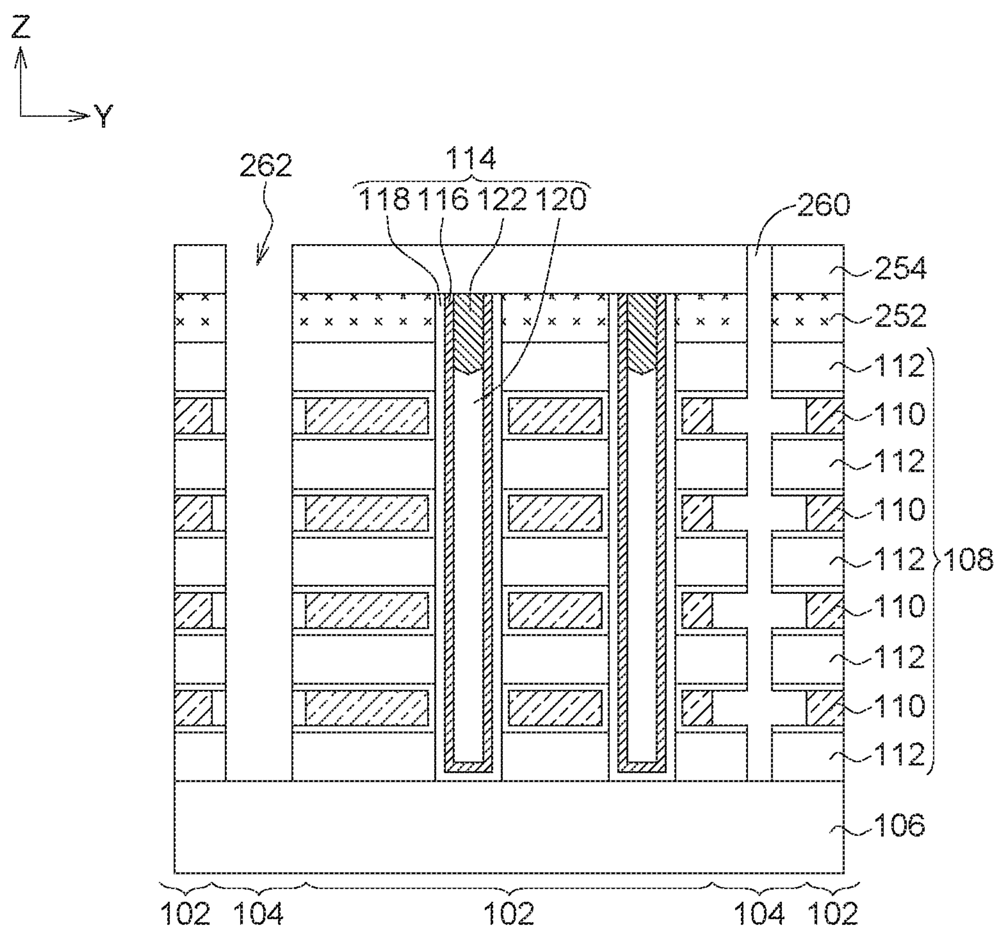
Figure 9A:
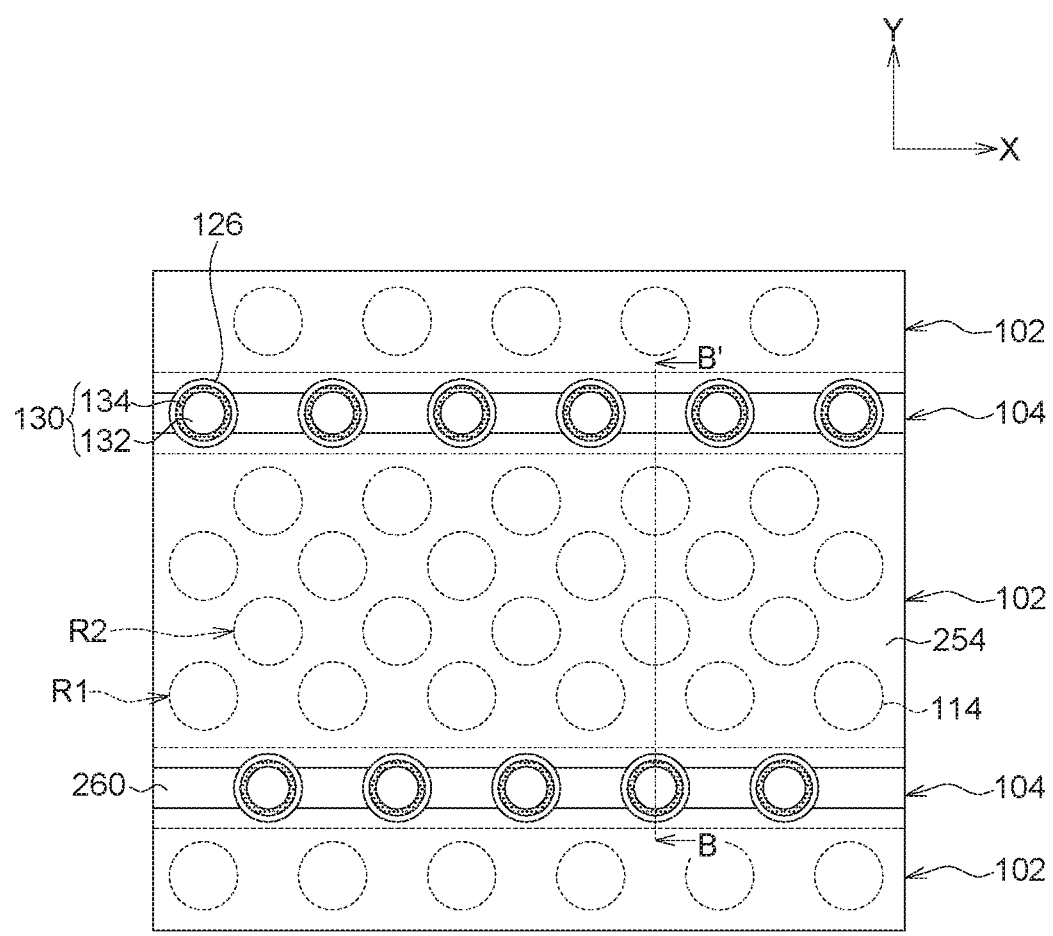
Figure 9B:
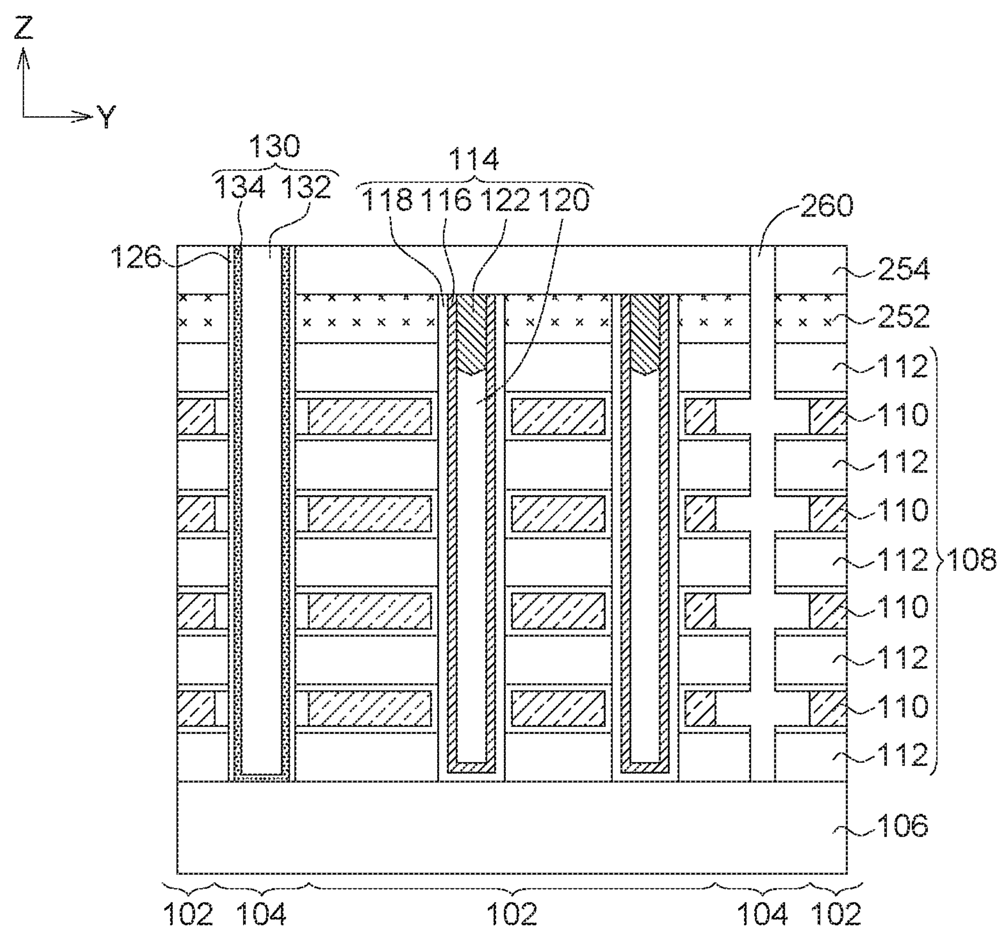

As shown in FIGS. 8A-8B, a plurality of holes 262 are formed penetrating through the isolation structures 104, such as by etching. Each of the holes 262 has a circular cross section. As shown in FIGS. 9A-9B, barrier layers 134 are formed on sidewalls of the holes 262, respectively. Then, the holes 262 are filled with a conductive material to form conductive cores 132 in the holes 262, respectively. The conductive material may be tungsten. In some embodiments, before forming the barrier layers 134, insulating liners 126 may be formed on the sidewalls of the holes 262, respectively, for promising a proper isolation between the sub-array structures 102. As such, the plurality of conductive columns 130 are formed in the isolation structures 104. The conductive columns 130 penetrate through the isolation structures 104. Each of the conductive columns 130 has a circular cross section.

In some embodiments, as shown in FIG. 9A, the active structures 114 in a first row R1 in the each of the sub-array structures 102 are adjacent to the conductive columns 130 formed in one of the isolation structures 104, and the active structures 114 in the first row R1 and the conductive columns 130 formed in the one of the isolation structures 104 are arranged in an alternate manner. In some embodiments, the active structures 114 in a second row R2 in the each of the sub-array structures 102 are adjacent to the active structures 114 in the first row R1 at a side opposite to the one of the isolation structures 104, the active structures 114 in the second row R2 and the active structures 114 in the first row R1 are arranged in an alternate manner, and the active structures 114 in the second row R2 and the conductive columns 130 formed in the one of the isolation structures 104 are aligned.

Figure 10A:
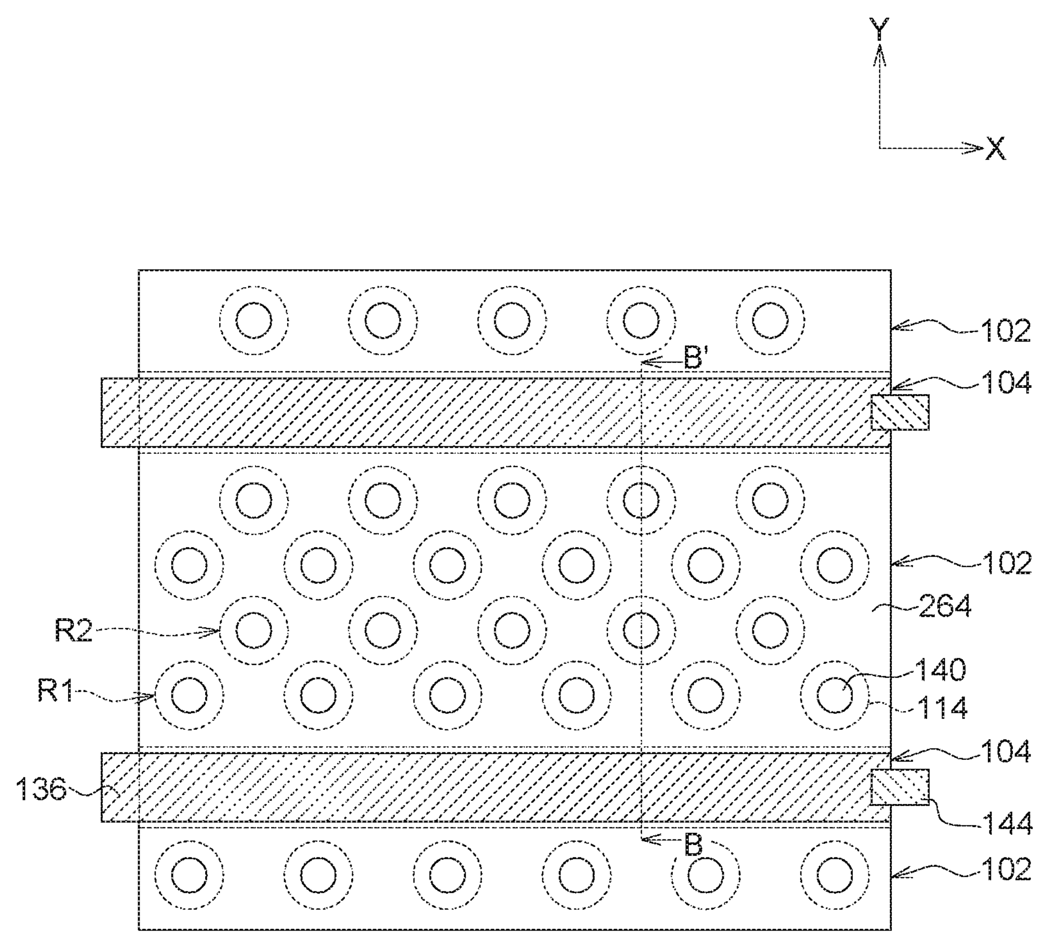
Figure 10B:
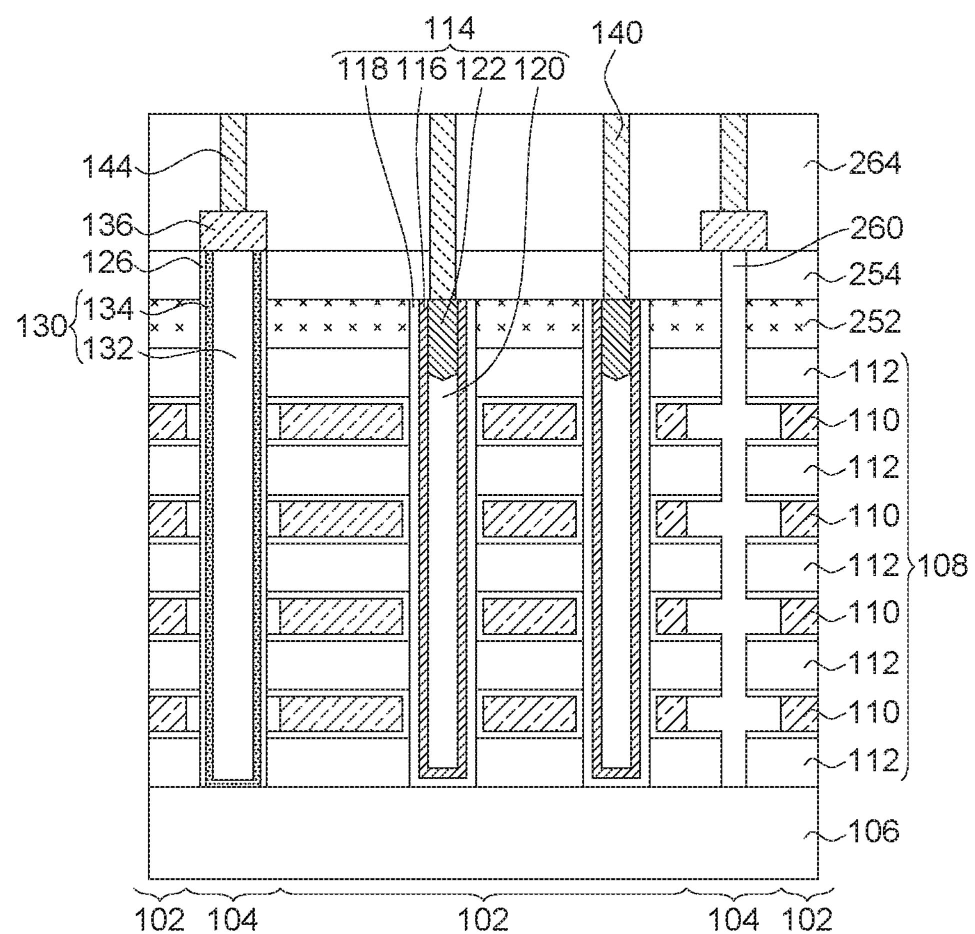

As shown in FIGS. 10A-10B, a plurality of conductive lines 136 may be formed on the conductive columns 130. Each of the conductive lines 136 connects the conductive columns 130 correspondingly formed in each of the isolation structures 104. In some embodiments, as shown in FIGS. 10A-10B, an interlayer dielectric layer 264 may be formed on the interlayer dielectric layer 254, and contacts 140 and 144 are formed penetrating through the interlayer dielectric layer 264. The contacts 140 are formed on the active structures 114 for coupling the active structures 114 to, for example, bit lines (142). The contacts 144 are formed on the conductive lines 136 for coupling the conductive structures to overlying conductive lines (146). It can be understood that other typical processes for forming a semiconductor structure, particularly a 3D vertical channel NAND memory structure, may be conducted thereafter.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:

a plurality of sub-array structures separated from each other by a plurality of isolation structures;

a three-dimensional array of memory cells, wherein the memory cells comprise a plurality of cell groups disposed in the sub-array structures, respectively; and a plurality of conductive structures, wherein each of the conductive structures comprises a plurality of conductive columns correspondingly disposed in each of the isolation structures along an extending direction of the isolation structures, the conductive columns penetrating through the each of the isolation structures, and each of the conductive columns has a circular cross section.

2. The semiconductor structure according to claim 1, wherein the each of the conductive columns comprises:

a conductive core having a circular cross section; and a barrier layer surrounding the conductive core.

3. The semiconductor structure according to claim 1, wherein the each of the isolation structures comprises:

a plurality of insulating liners surrounding the conductive columns disposed in the each of the isolation structures, respectively; and a plurality of insulating walls connecting the insulating liners.

4. The semiconductor structure according to claim 1, wherein the each of the conductive structures further comprises:

a conductive line disposed on the conductive columns, the conductive line connecting the conductive columns.

5. The semiconductor structure according to claim 1, wherein the conductive structures are bit line structures.

6. The semiconductor structure according to claim 1, wherein each of the sub-array structures comprises:

a stack comprising alternately stacked conductive layers and insulating layers; and a plurality of active structures penetrating through the stack, each of the active structures comprising:

a channel layer; and a memory layer disposed between the channel layer and the stack;

wherein the memory cells in the cell group disposed in the each of the sub-array structures are defined by cross points between the conductive layers of the stack and the active structures.

7. The semiconductor structure according to claim 6, wherein the active structures in a first row are disposed adjacent to the conductive columns disposed in one of the isolation structures, and the active structures in the first row and the conductive columns disposed in the one of the isolation structures are arranged in an alternate manner.

8. The semiconductor structure according to claim 7, wherein the active structures in a second row are disposed adjacent to the active structures in the first row at a side opposite to the one of the isolation structures, the active structures in the second row and the active structures in the first row are arranged in an alternate manner, and the active structures in the second row and the conductive columns disposed in the one of the isolation structures are aligned.

9. The semiconductor structure according to claim 7, wherein one of the conductive columns disposed in the one of the isolation structures and adjacent two of the active structures in the first row are arranged to form an isosceles triangle.

10. The semiconductor structure according to claim 6, wherein the each of the active structures further comprise a conductive connector for coupling the channel layer to a bit line, and the conductive layers comprise word lines.

11. The semiconductor structure according to claim 6, wherein the conductive columns and the conductive layers comprise tungsten.

12. A method for forming a semiconductor structure, comprising:

providing an initial structure, wherein the initial structure comprises a plurality of sub-array structures separated from each other by a plurality of isolation regions, each of the sub-array structures comprises a stack and a plurality of active structures penetrating through the stack, and each of the active structures comprises a channel layer and a memory layer formed between the channel layer and the stack;

forming a plurality of isolation structures in the isolation regions, respectively; and forming a plurality of conductive columns in the isolation structures, the conductive columns penetrating through the isolation structures, each of the conductive columns having a circular cross section.

13. The method according to claim 12, wherein the stacks of the initial structure comprise alternately stacked sacrificial layers and insulating layers, and the method further comprises:

forming a plurality of trenches in the isolation regions, respectively; and replacing the sacrificial layers with conductive layers through the trenches.

14. The method according to claim 13, wherein forming the isolation structures comprises:

removing the conductive layers in the isolation regions through the trenches; and filling an insulating material into the trenches and spaces produced by removing the conductive layers in the isolation regions.

15. The method according to claim 12, wherein forming the conductive columns comprises:

forming a plurality of holes penetrating through the isolation structures, each of the holes has a circular cross section;

forming barrier layers on sidewalls of the holes, respectively; and filling the holes with a conductive material to form conductive cores in the holes, respectively.

16. The method according to claim 15, further comprising:

before forming the barrier layers, forming insulating liners on the sidewalls of the holes, respectively.

17. The method according to claim 15, wherein the conductive material is tungsten.

18. The method according to claim 12, further comprising:

forming a plurality of conductive lines on the conductive columns, each of the conductive lines connecting the conductive columns correspondingly formed in each of the isolation structures.

19. The method according to claim 12, wherein the active structures in a first row in the each of the sub-array structures are adjacent to the conductive columns formed in one of the isolation structures, and the active structures in the first row and the conductive columns formed in the one of the isolation structures are arranged in an alternate manner.

20. The method according to claim 19, wherein the active structures in a second row in the each of the sub-array structures are adjacent to the active structures in the first row at a side opposite to the one of the isolation structures, the active structures in the second row and the active structures in the first row are arranged in an alternate manner, and the active structures in the second row and the conductive columns formed in the one of the isolation structures are aligned.

* * * * *